United States Patent [19]
Ferry

[11] Patent Number: 5,627,538
[45] Date of Patent: May 6, 1997

[54] CONVOLUTIONAL DIGITAL TO ANALOG CONVERTER

[75] Inventor: Michel Ferry, Vallauris, France

[73] Assignee: International Business Machines Corporation, Armonk, N.Y.

[21] Appl. No.: 368,199

[22] Filed: Jan. 4, 1995

[30] Foreign Application Priority Data

Jan. 14, 1993 [EP] European Pat. Off. ............ 94480007

[51] Int. Cl.$^6$ ................................................ H03M 1/66
[52] U.S. Cl. ................................................ 341/144
[58] Field of Search ................................ 341/144, 145; 364/413.2, 413.21

[56] References Cited

U.S. PATENT DOCUMENTS 5,208,596  5/1993  Dieterich ................................ 341/144

FOREIGN PATENT DOCUMENTS 2219158  11/1989  United Kingdom .

OTHER PUBLICATIONS

1989 International Conference on Acoustics, Speech and Signal Processing vol. 2, pp. 1243–1246.

*Primary Examiner*—Brian K. Young
*Attorney, Agent, or Firm*—Gerald R. Woods

[57] ABSTRACT

A convolutional digital to analog converter (CDAC) according to the present invention enables to apply the convolution operation between the digital input signals and the Fourrier transform of a filtering transfer function. This convolution operation is combined with interleaved sampling performed by a clock splitter and also a multiplier generator device. In more details, the present convolutional DAC comprises a device splitting the incoming data for deserializing them and for sorting and storing the data in the respective N data buffers, a device splitting the clock signal (Fb) of the CDAC into N signals having a frequency equal to Fb/N clocking the respective data buffer, N multiplying DAC receiving data from the corresponding data buffer through a corresponding data bus, and N multiplier generators using identical periodic functions and being shifted by a delay respective to each other according to the clock splitter for generating the function to be convoluted with the digital inputs in the respective multiplying DACs. Second and third order for which N is equal to 1 and 2 of the convolutional DAC according to the present invention are described in detail in the description.

4 Claims, 10 Drawing Sheets

CONVOLUTIONAL DIGITAL TO ANALOG CONVERTER

FIELD OF THE INVENTION

The present invention relates to a device for converting a digital input into an analog output, and more particularly to a Convolutional Digital to Analog Converter which generates a smoothed signal and has consequently a limited high frequency spectrum.

BACKGROUND ART

Communicating between the analog and digital worlds requires devices that can translate the language of the two worlds. A digital-to-analog (D/A) converter accepts a digital word as its input and translates, or converts,this word to an analog voltage. Digital to analog converters (DAC) are components widely used in data processingsystems. The basic elements of many DACs are a resistornetwork, current or voltage switches, a reference supply,and an output operational amplifier.

Figure 1:
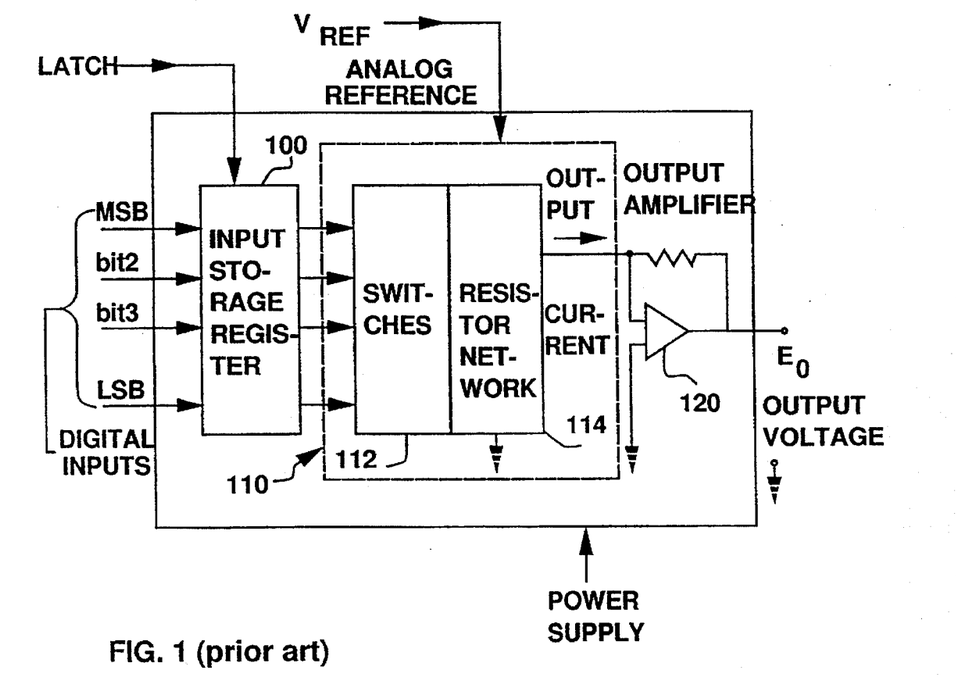
FIG. 1 shows the structure of a conventional DAC in the prior art.

FIG. 1 shows the structure of a conventional DAC. The basic converter is enclosed within the dashed rectangle(110). It comprises digitally operated switches (112)connected to a resistor network (114) to which is appliedan analog reference voltage Vref. The resistor network 114generates an output current. The basic converter receivesinputs from an input storage register (100) having digitalinputs u(i=1 ... n) of different weights and an input latchsignal. Each digital input u(i=1 ... n) is equal to 1 or 0. The output current of the basic converter 110 is then connected to an operational amplifier which has a feedback resistor. The output voltage $E_o$ of said amplifier depends on the analog reference voltage Vref, the values of the digital inputs u(i) according to their weight. Instead ofusing a voltage reference, a current reference may be used as will be described later on in the present invention.

The DAC circuitry involves a voltage or current reference,a resistive ladder network that derives weighted currents or voltages, usually as discrete fractions of the reference, and a set of switches, operated by the digital in puts, that determine which currents or voltages will be summed to constitute the output. The output of the DAC is proportional to the product of the digital input value and the reference. In many applications, the reference is fixed, and the output bears a fixed proportion to the digital input. In other applications, the reference, as well as the digital input, can vary; a DAC that is used in these applications is thus called a multiplying DAC. It is principally used for imparting a digitally controlled scale factor, or gain to analog input signal applied at the reference terminal.

Therefore, a DAC is often used for multiplying a sampled digital input by another analog and continuously variable input. It also has a built-in function which is to sequence the samples with a regular interval.

Figure 2A:
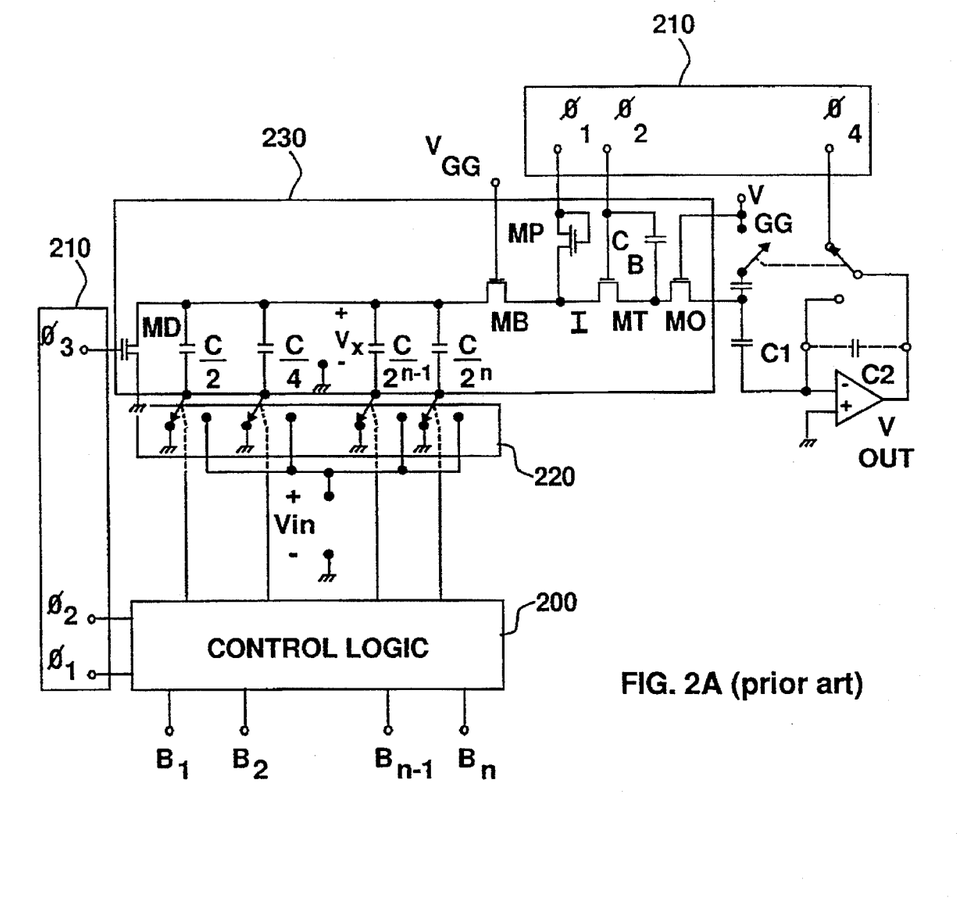
FIGS. 2A and 2B show an example of a multiplying DAC and its implementation (prior art).

In the article "A charge-transfer multiplying DAC" by Jos. F. Albarran from the IEEE journal vol. SC 11, pp. 772–779, Dec 1976, a new charge-transfer multiplying DAC employs an array of binary-weighted MOS capacitors and MOS resistors as its only elements. The DAC can be fabricated on the same chip and by the same process and provides two or four quadrant multiplication. An experimental n-channel metal-gate MOS realization demonstrated accuracy to 7 bits plus sign, and a 200 kHz bandwidth. The frequency of this implementation is not high enough to be used in the present invention because it should reach at least 10 MHz. This article discloses a circuit, refer to FIG. 2-A, that contains a control logic circuit (200) receiving inputs (B1, ... BN), a clock circuit (210), a plurality of switches (220) and an integrated portion circuit (230) which comprises a N-bit binary weighted capacitor array, and transistors. The integrator uses a FET-input operational amplifier and its output is sampled. This DAC may be used as a multiplying DAC in the present invention but cannot be a substitute for the whole device of the present implementation.

Figure 2B:
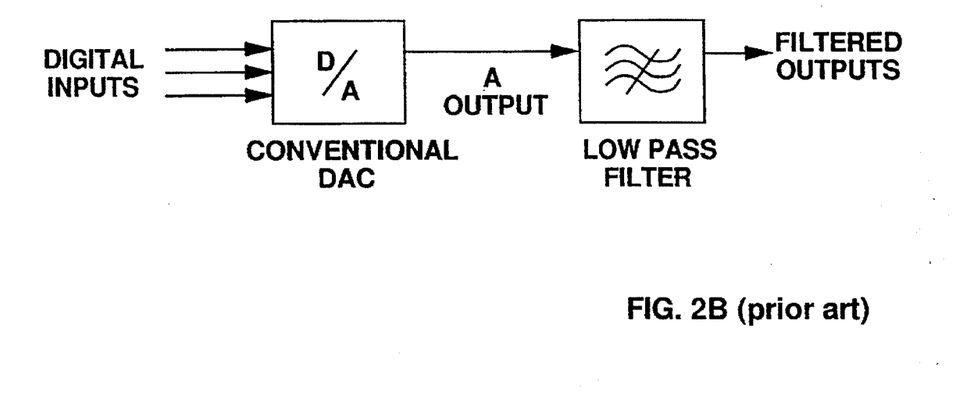

The high frequency spectrum of a conventional converter can be attributed to the abrupt changes of the converter output when the digital input value changes. For this reason, a conventional DAC is always followed by a more or less complex low pass filter, the task of which is to smooth out the converter output (FIG. 2-B).

Whereas at low frequencies, techniques already exist that allow such a filter to be implemented in silicon, it is no longer the case at high frequencies.

SUMMARY OF THE INVENTION

It is the main object of the invention to design a DAC that generates a smoothed signal and has consequently a limited high frequency spectrum.

Another object of the invention is to devise a DAC that is suited to silicon integration.

The device according to the present invention applies a convolution operation between the digital input signals and the Fourrier transform of the filtering transfer function. This convolution operation is combined with interleaved sampling performed by a clock splitter and also a multiplier generator device.

The present device, receiving incoming data on a data bus and being clocked by a clock signal of frequency Fb, comprises:

means for receiving said incoming data and for splitting them into N data, said means being composed of N shift registers and N data buffers, the N shift registers sort ing the incoming data to store the N data successively in the respective data buffers;

means for splitting the clock signal (Fb) into N signals having a frequency equal to Fb/N with a phase delay of N/Fb respective to each other, each said signal clocking the respective data buffer;

means comprising N multiplying digital to analog converters being delayed by a phase T=N/Fb, each said multiplying DAC receiving data from the corresponding data buffer through a corresponding data bus; and means for providing N multiplier generators, each one using identical periodic functions (M1, ... , Mn) of period N/Fb, the phase of each multiplier generator being shifted by a delay of N/Fb respective to the previous generator according to the corresponding phase of the clock split ter, each said multiplier generator being clocked by the corresponding clock signal of frequency (Fb/N) for modulating the multiplying DAC reference with periodic signals (G1, ... Gn) which are convoluted with the digital inputs.

DETAILED DESCRIPTION OF THE DRAWINGS

Figure 3:
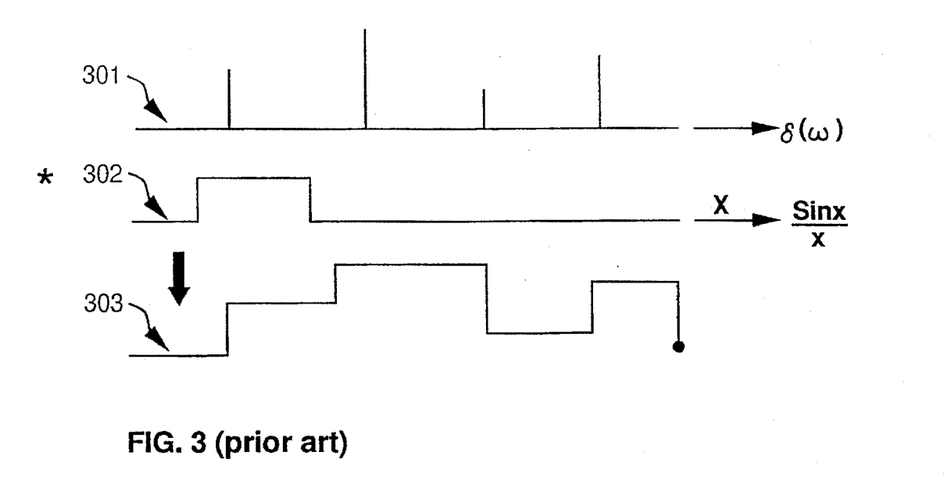
FIG. 3 shows a stair case function which is obtained by the convolution to the first order of digital inputs and the gate function and that corresponds to a conventional DAC.

FIG. 3 shows a convolution to the first order of digital inputs and the gate function. The time domain output of a conventional DAC can be seen as the convolution of the digital input signals (301) with a gate function (302) that is 0 before a time t, 1 between t and t+T, wherein T is the sampling time interval, and 0 after t+T. The result of this convolution is a stair case function (303), each step has the value of each one of the digital inputs. The frequency domain output of such a converter, according to Fourrier, is the product of the input signal spectrum by the Fourrier transform of the gate function:

$$\sin(pi*f*T)/(pi*f*T)=\text{sinc } f.$$

The convolution of the digital inputs and the gate function may be written in this form:

$$\int_{-\infty}^{+\infty} (1-\Delta)\delta(\tau-t)c(t)dt \qquad (1)$$

wherein $\Delta$: delay operator $\tau(t)$: Dirac impulse $c(t)$: Gate function

Figure 4:
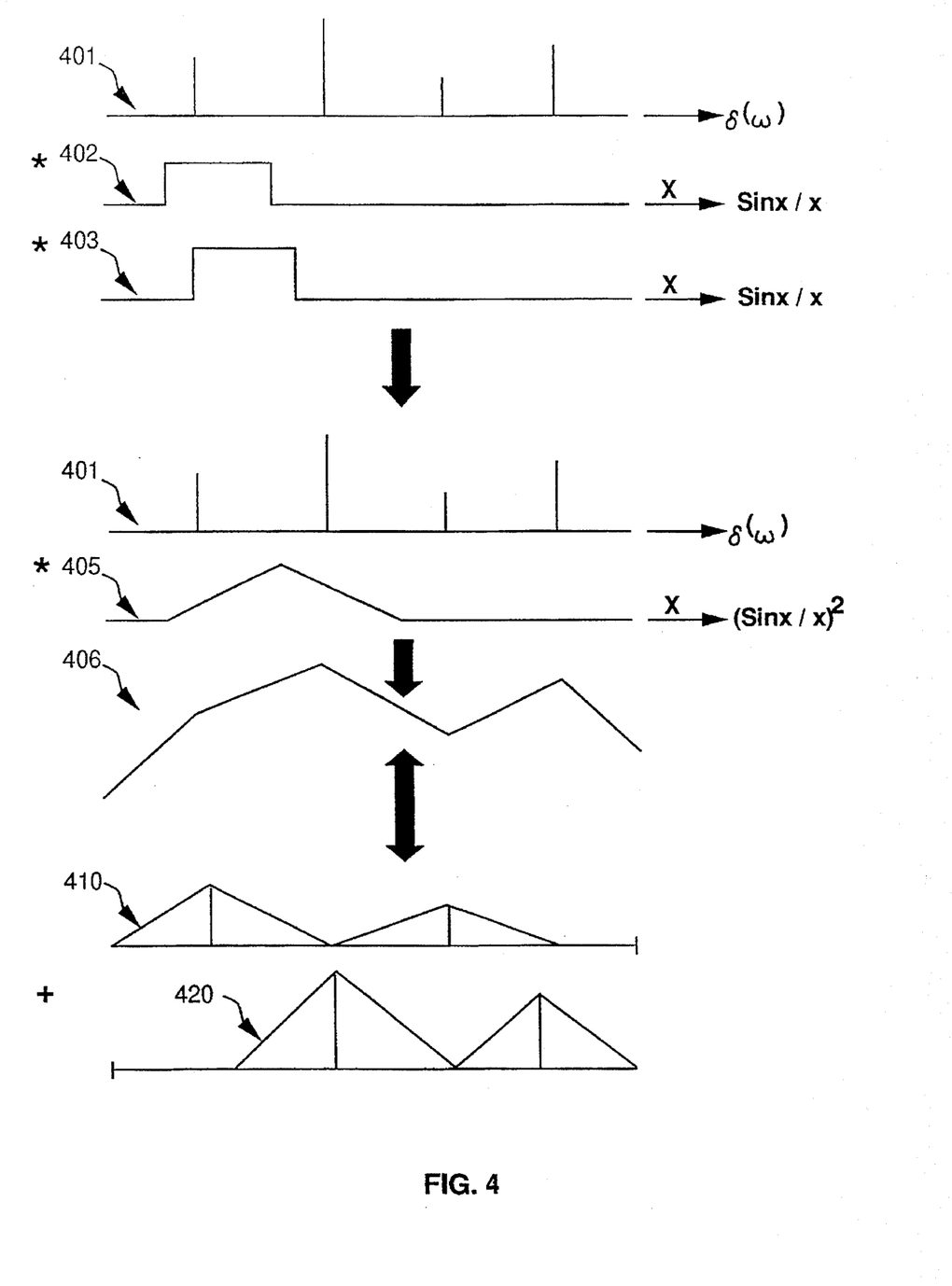
FIG. 4 shows a linear piece-wise function which is obtained by the convolution to the second order of digital inputs and twice the gate functions separated by a delay.

FIG. 4 shows a convolution to the second order of digital inputs and twice the gate functions.

According to what we have noticed in the previous figure, one may iterate the use of the convolution of the first order to the second order by convoluting twice the gate functions (402 and 403) before convoluting the result with the digital inputs (401).

The convolution of the gate functions of T width results in a symmetric triangular signal (405) of 2T width.

The convolution of the triangle and the digital inputs yields a linear piece-wise function (406) which may be the approximation of a curve. Besides, this linear piece-wise function may represented by the addition of two triangular shaped signals (410 and 420) being separated by a delay T. The first triangle shaped signal (410) starts when the first digital sample is issued with a first con stant slope proportional to the sample value and decreases linearly to the value 0. Afterwards, this signal increases linearly again when the third digital input is issued and decreases linearly for each odd digital sample, whereas the second triangular shaped signal (420) increases and decreases linearly every other digital input. Both triangle shaped signals have therefore a phase difference which corresponds to the regular time interval of the digital inputs. By interleaving both triangular diagrams and summing them up, one may obtain the linear piece-wise function.

Therefore, one should devise a convolutional DAC (CDAC) which can combine two components in order to have the property described above. The first and the second component must generate respectively an output which is similar to the triangular signal (410) and the signal (420). Therefore in each component one may use a multiply ing DAC and a device which enables to perform the convolution operation so that the frequency domain output of such a Convolution DAC, according to Fourrier, is the product of the input signal spectrum by the function. (sinc (f) **2) which is the Fourrier transform of the convolution of two gate functions.

$$\int_{-\infty}^{+\infty} (1-2\Delta+\Delta^2)\delta(\tau-t)c(t)dt \qquad (2)$$

Figure 5:
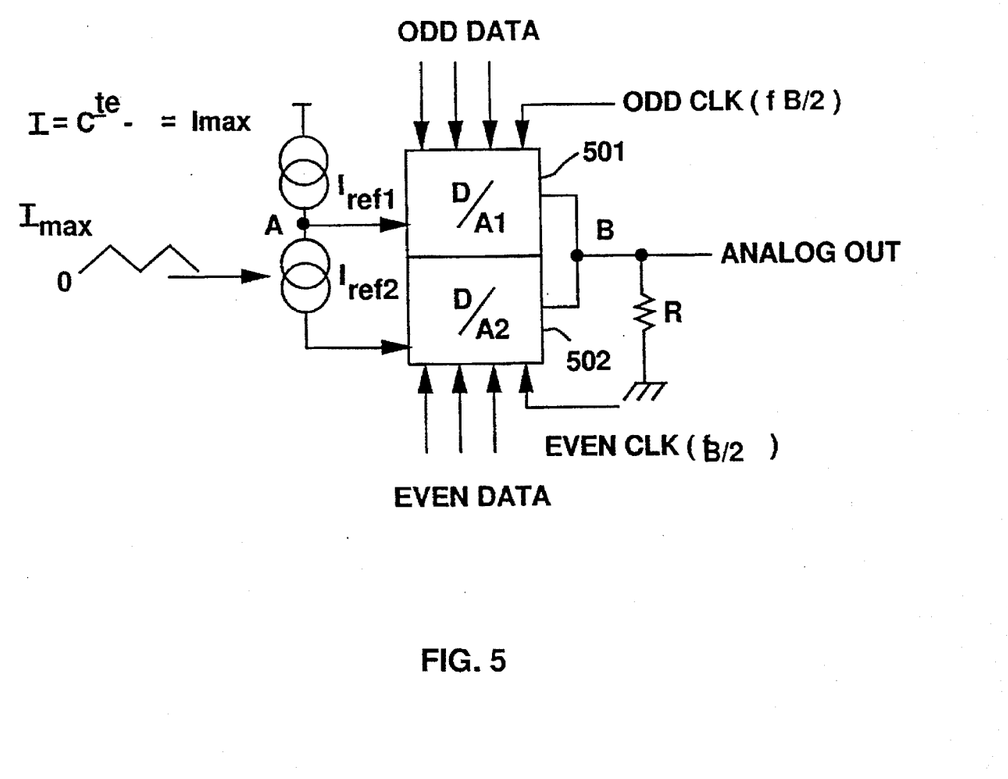
FIG. 5 shows the implementation of the DAC with twin interleaved triangular generators.

FIG. 5 shows the implementation of the CDAC that has the property described above. The CDAC has twin interleaved triangular generators.

Therefore, the CDAC of the present invention includes the combination of two conventional multiplying MDACs: MDAC1 (501) and MDAC2 (502). MDAC1 receives odd data and odd clock having the frequency of (Fb/2). MDAC2 receives even data and even clock having also the same frequency (Fb/2). Each MDAC is fed by a reference current which is triangular. The reference current (Iref1) of MDAC1 added to the reference current (Iref2) of MDAC2 is equal to a constant current Imax. This current Imax feeds in parallel both MDACs with their respective reference currents, creating therefore a phase difference between the triangular signals Iref1 and Iref2 which have the same amplitude Imax. In this simple case Iref1 and Iref2 have a common node A.

The output of each MDAC is connected to a summing node B. This node B is connected to the ground through a resistor R before it generates the analog output which is the linear piece-wise function obtained in the previous FIG. 4.

As a summary of this very simple case of TIT (twin interleaved triangular generators) DAC, the circuit is composed of:

a combination of two conventional multiplying MDACs, a data splitter which enables separation of the data into odd data and even data, a clock splitter which generates a two identical clocks for both MDACs, and two sources of reference current which are in the present case the triangular signals Iref1 and Iref2 having the same amplitude and a phase difference.

The design of this circuit may be generalized to the upper order, and instead of obtaining a linear piece-wise function, one may approximate a curve by a parabolic piece-wise function.

Figure 6:
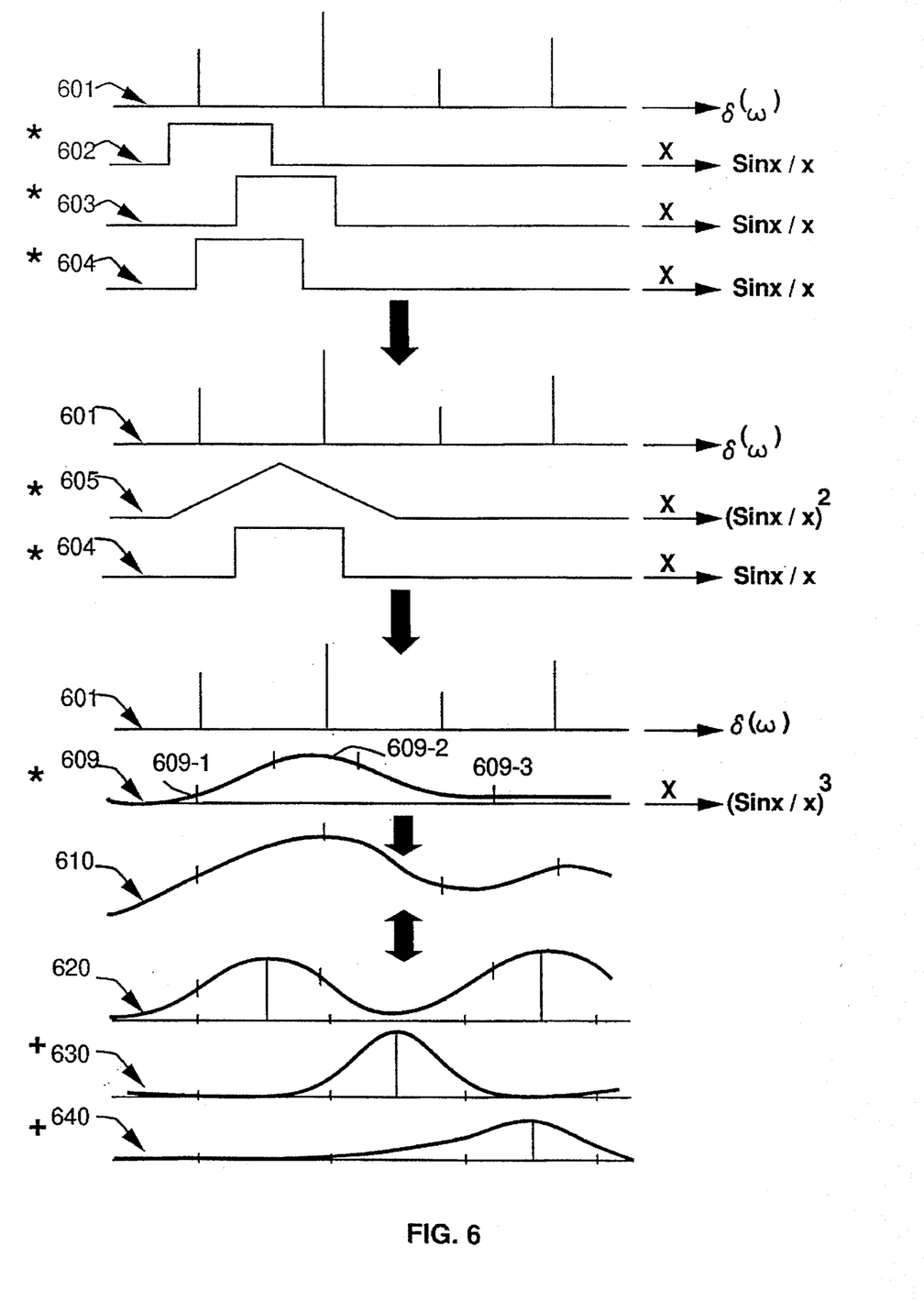
FIG. 6 shows a parabolic piece-wise function which is obtained by the convolution to the third order of digital inputs and three times the gate functions separated by a delay.

FIG. 6 shows a convolution to the third order of digital inputs and three times the gate functions.

The iteration of the convolution of the second order to the third order by convoluting the triangular signal with the gate function before convoluting the result with the digital inputs yields a parabolic analog output.

The convolution of the first (602) and the second (603) gate functions results in a triangular signal (605) as we have previously seen. The convolution of this triangular signal with another gate function (604) results in a parabolic signal (609). This parabolic signal is the juxtaposition of three parabolic curves whose slopes are of different signs. The first parabolic curve (609-1) is concave. The second parabolic curve (609-2) is convex and the third one (609-3) is concave. Therefore, this parabolic signal (609) spreads over a lapse of three sampling periods and is symmetrical.

Afterwards, the convolution of the parabolic signal (609) obtained and the digital inputs (601) results in a parabolic piece-wise function (610) which is a better approximation of a curve than a triangular piece-wise function.

Besides, this parabolic piece-wise function (610) may be represented by the addition of three parabolic-signals (620, 630, 640) having the same phase difference of a sampling period of the digital inputs.

The first parabolic-signal (620) starts when the first digital signal is issued, peaks to a maximum proportional to that sample and decreases to zero three sampling time-periods later. It starts rising again when the fourth digital sample is issued, peaks to maximum proportional to that sample and decreases again to zero three sampling time-periods later and so on.

The second parabolic-signal behaves in the same way respective to samples 2 and 5 of the digital signals and so on, and so does the third parabolic-signal respective to samples 3 and 6 of the digital signals and so on.

Therefore, one should devise a convolutional DAC (CDAC) which can combine three components in order to have the property described above. Each one of the three components must generate an output which corresponds respectively to the parabolic-signal (620), (630) and (640). Hence, in each component one may use a multiplying DAC and a device which enables to perform the convolution operation so that the frequency domain output of such a Convolution DAC, according to Fourrier, is the product of the input signal spectrum by the function (sinc (f) **3) which is the Fourrier transform of the convolution of three gate functions.

$$\int (1-3\Delta+3\Delta^2-\Delta^3)\delta(\tau-t)c(t)dt \quad (3)$$

Figure 7:
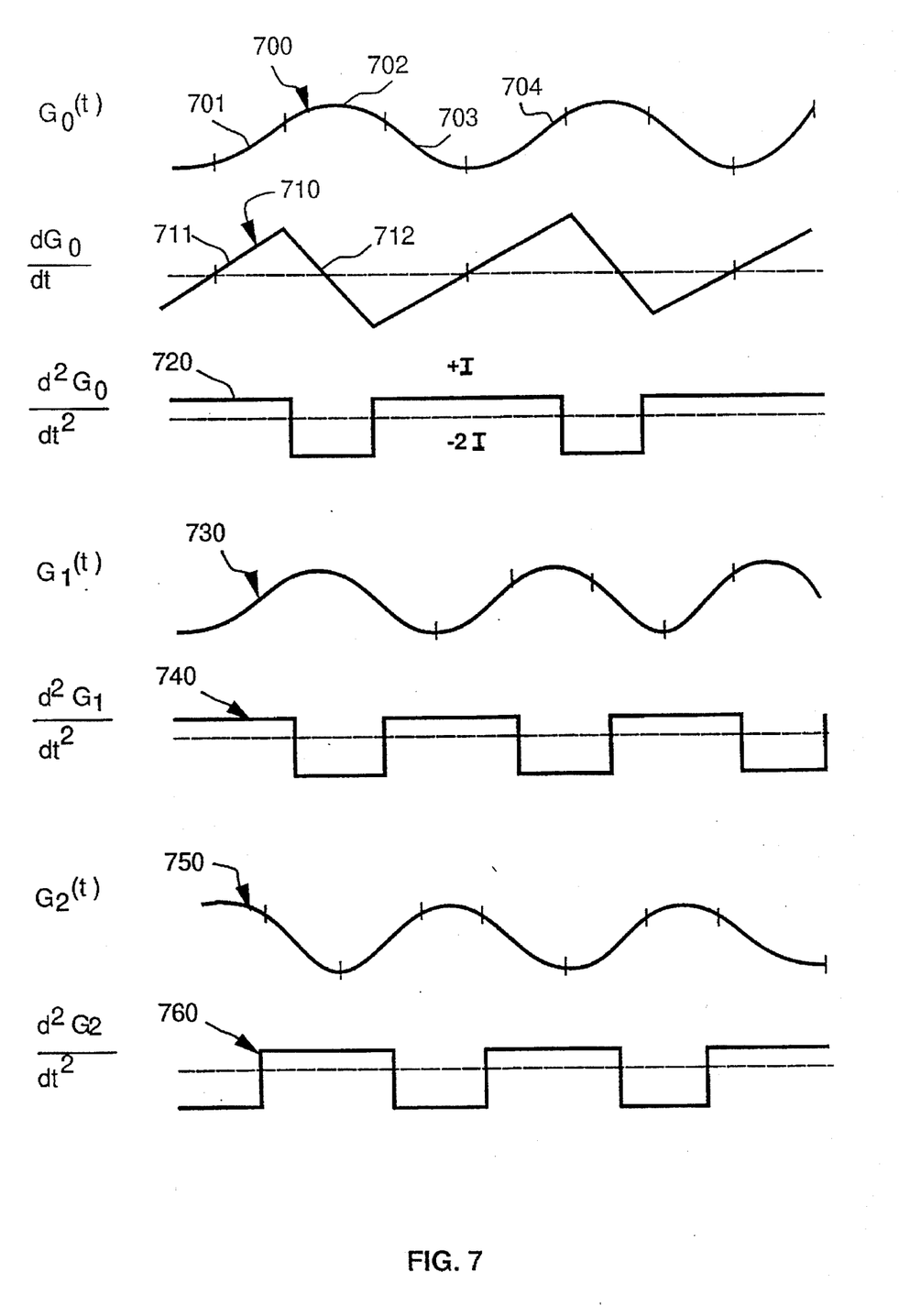
FIG. 7 shows a parabolic generator synthesis.

FIG. 7 represents the synthesis of the parabolic generators in the case of a convolution to the third order.

As is seen in the previous figure, the parabolic piece-wise function (610) is obtained by the addition of the three parabolic signals (620, 630 or 640). Therefore one should define signals G0, G1 and G2 which are to be convoluted with the corresponding digital inputs in order to obtain the parabolic signals (620, 630 and 640). G0(t), G1(t) and G2(t) are reference signals which are periodical and have the same period corresponding to three sampling time period of the digital inputs. Each parabolic signal (G0(t), G1(t) and G2(t)) (700, 730 and 750) is the juxtaposition of three parabolic curves which are concave, convex and concave.

The first reference signal G0(t) (700) is the combination signal is the combination of three parabolic curves (701, 702, 703 and so on). The derivative of this reference signal corresponds to the derivative of the three curves which gives a first straight line (711) whose slope is +1 during a time-period, a second line (712) whose slope is −2 during a time-period and a third line (713) whose slope is +1 during a time-period. As a whole, the derivative of the reference signal G0(t) (700) is a periodical signal (710) which is the juxtaposition of the three successive straight lines.

The second derivative of G0(t) gives therefore a periodical square signal (720) having the values +1 and −2. This square signal may be used to represent a reference current which is easily generated by a device.

For the parabolic signal G1(t) (730) which is also the juxtaposition of a concave, convex and concave curves, the same derivation may be applied and a square signal (740) is obtained having the values +1 and −2 and whose period is equal to three sampling time periods. So does the parabolic signal G2(t) (750) which has the corresponding second derivative (760). The three square signals (720, 740 and 760) have the same characteristics: they have the same amplitude (oscillating between +1 and −2), the same period (three sampling time period) and a phase difference between each others.

Therefore, the reference signals G0(t), G1(t) and G2(t) are determined by a double integration of the square signals (720, 740 and 760) which are easy to generate. In the present illustration, the square signals represent current reference signals, but one may use another physical unit.

The sum of the reference signals G0(t), G1(t) and G2(t) is constant because the sum of their derivatives is equal to zero, and so does the sum of their second derivatives.

Figure 8:
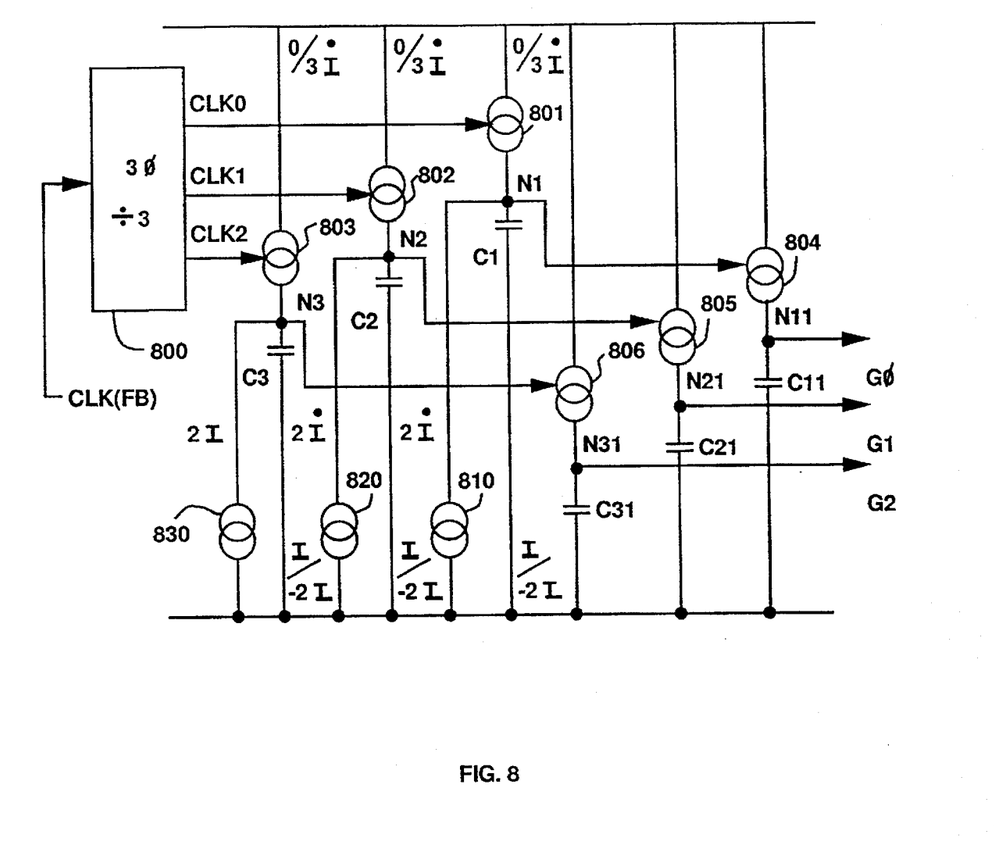
FIG. 8 shows the implementation of the parabolic generator.

FIG. 8 represents an example of the implementation of the parabolic generator which corresponds to the case of a third order convolution. This figure shows the implementation of a device which enables to obtain the three periodic parabolic signals G0 (t) (901), G1 (t) (911) and G2 (t) (921).

For this implementation, a clock splitter (800) is required to split a base clock signal having a frequency Fb into three clock signals (clk0, clk1 and clk2) whose frequencies are equal to (Fb/3). Each clock signal controls a current generator (801, 802 or 803) which generates to the respective node-voltages (N1, N2 and N3) a reference current equal to 0 or 3I. Each node-voltage is also connected to another current generator (810, 820 or 830) which generates a constant current whose value is equal to 2I, and to a capacitance (C1, C2 or C3) whose current is equal to I or −2I (which corresponds to the values of the second derivative of G0(t), G1(t) and G2(t)). The resulting voltage across these capacitors is proportional to the integral of these currents that is a saw-tooth of appropriate slopes. Each one of these node-voltages (N1, N2 and N3) also enables to control three other respective current generators (804, 805 and 806) that feed respectively three capacitors (C11, C21 and C31) with a current proportional to the voltage at nodes (N1, N2 or N3). The integration process is repeated across the three capacitors (C11, C21 and C31) and the voltages detected respectively at nodes (N11, N21 or N31) are now piece-wise parabolic. The current that is detected through each one of the capacitances (C11, C21 or C31) corresponds respectively to the signal of the derivative of G0(t), G1(t) and G2(t). Those node-voltages (N11, N21 and N31) enable to control the three signals G0(t), G1(t) and G2(t) in order to be convoluted with digital inputs in a multiplying DAC that is shown in FIG. 9.

Figure 9:
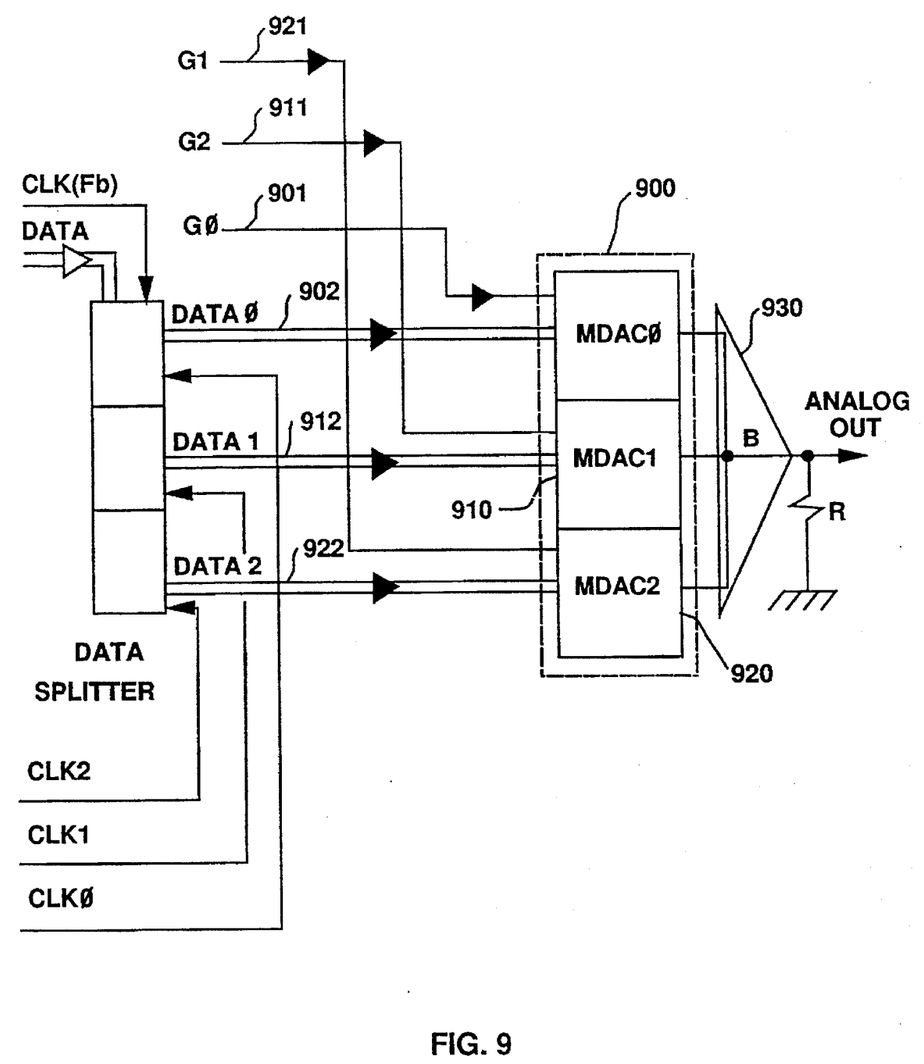
FIG. 9 shows the implementation of the DAC with triple interleaved parabolic generators.

FIG. 9 shows a triple interleaved parabolic generators of a convolutional DAC of a third order.

The three signals G0(t) (901), G1(t) (911) and G2(t) (921) obtained by the previous implementation (FIG. 8) are respectively put into three multiplying DACs (MDAC0 (900), MDAC1 (910) and MDAC2 (920)). Each MDAC (900, 910 or 920) also receives from a data splitter its corresponding data (Data0 (902), Data1 (912) and Data2 (922)). The previously mentioned clock splitter also transmits clock pulses (clk0, clk1 and clk2) to the respective data splitter in order to respect the phase difference of the three data signals. The output signals of each MDAC are afterwards added (930) at node B. This node B is also connected to a resistor R before it generates the analog output in order to obtain the parabolic piece-wise function (610) mentioned in FIG. 6.

Also to summarize this case of Triple Interleaved Parabolic DAC, different parts are gathered to compose:

a combination of three conventional multiplying DACs, a data splitter which splits the received data and transmits them to the corresponding MDAC, a clock splitter in order to divide the initial frequency into three equal clock signals with a phase delay of 3/Fb to the data splitter and the parabolic generator, and three sources of reference periodic parabolic signals G0(t), G1(t) and G2(t).

Thanks to the descriptions of the particular implementations of the Convolutional DAC to the second and to the third orders, one may now generalize the implementation to the Nth order.

Figure 10:
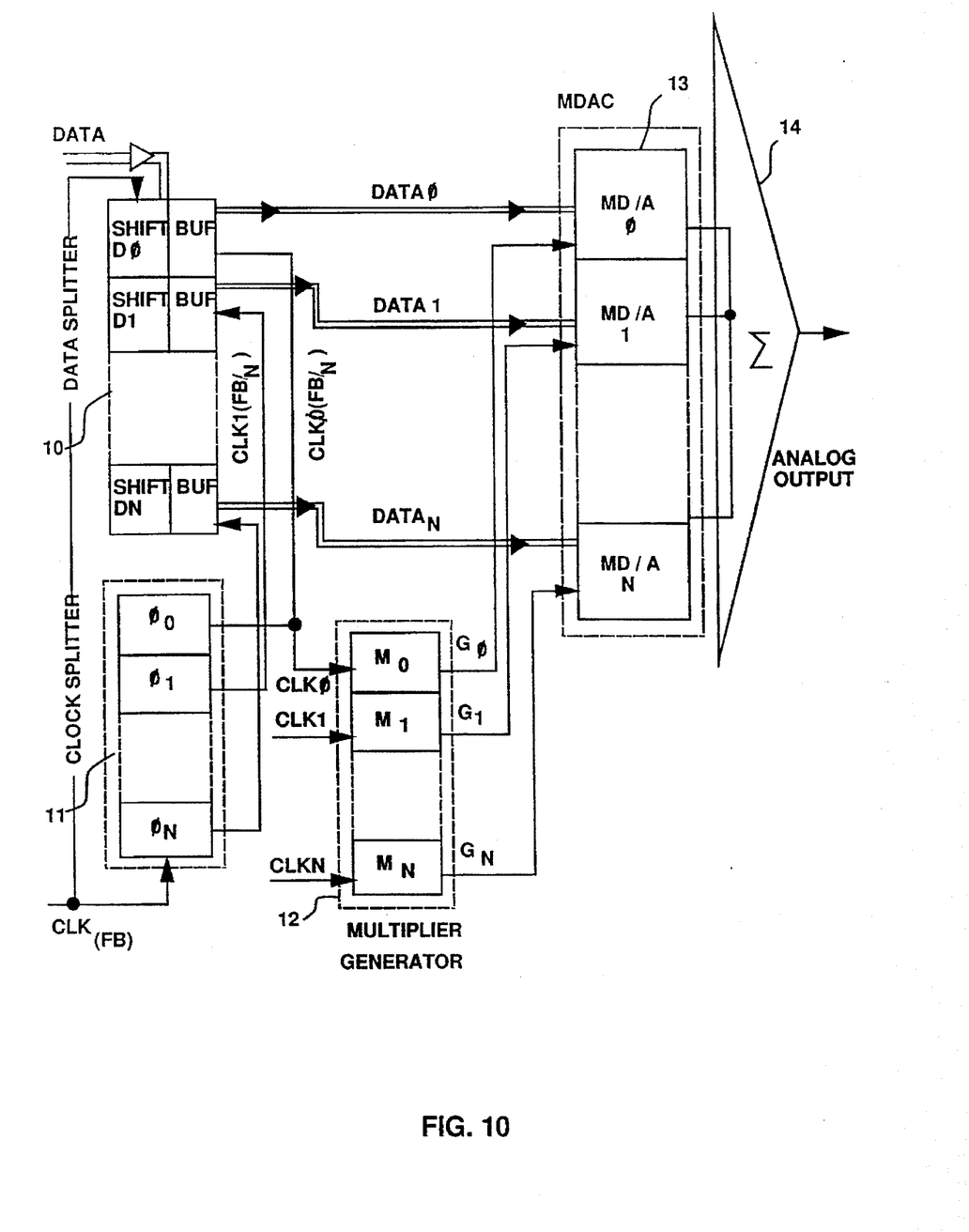
FIG. 10 shows the general convolutional DAC architecture according to present invention.

FIG. 10 shows the general implementation of a convolutional DAC architecture. This implementation comprises four major components:

a data splitter (10) which enables to split the received data into N+1 corresponding data, a clock splitter (11) which divides the initial frequency Fb into N+1 phases of frequency (Fb/(N+1)), a number N+1 of multiplier generators (12), each one generating a periodic signal G(t), and a combination (13) of N+1 conventional multiplying DACs which generates output signals to be added to transmit an analog output signal.

The data splitter (10) is composed of N+1 shift registers and N+1 data buffers. It receives data through a data bus and is clocked by a clock signal having a frequency equal to Fb. The shift registers enable to deserialize the in coming data into different buffers.

The data received by the data splitter are sorted according to their ranks (0 to N) in the sequence and stored in the corresponding buffers. Those buffers are respectively clocked by the clock splitter having the frequency of (Fb/(N+1)) with the appropriated phase. The data stored in the buffers are then transmitted to the corresponding multiplying DAC through a corresponding data bus which connects said buffer to said MDAC.

The clock splitter (11) which receives an input signal having a frequency Fb splits said signal into N+1 output signals having a frequency equal to Fb/(N+1) with a phase delay of (N+1)/Fb respective ot each other.

The multiplier generator (12) is composed of N+1 multiplier generators using N+1 identical periodic functions (M0, ..., Mn) of period (N+1)/Fb, each phase shifted by 2 pi/(N+1) respective to the previous generator, according to the corresponding phase of the clock splitter. Each multiplier generator is clocked with the corresponding clock signal issued by the clock splitter and modulates the multiplying DAC reference with periodic signals G0, ..., Gn.

For instance, the N+1 identical periodic functions (M0, ..., Mn) may be piece-wise parabolic, saw-tooth, raised cosine or any other periodic function.

The multiplying DAC (13) is composed of N+1 simple conventional multiplying DACs. Each simple MDAC receives data from the corresponding data buffer of the data splitter through the corresponding data bus and the corresponding periodic signals G0, ... or Gn from the associated multiplier generator. Then each one of the MDACs emits analog outputs which are received at a common summing node (14) which issues a final analog output.

If a (SinX/X)**(N+1) response is seeked, the implementation of triangular and parabolic interleaved DACs can be generalized to the (N+1)th order.

Figure 11:
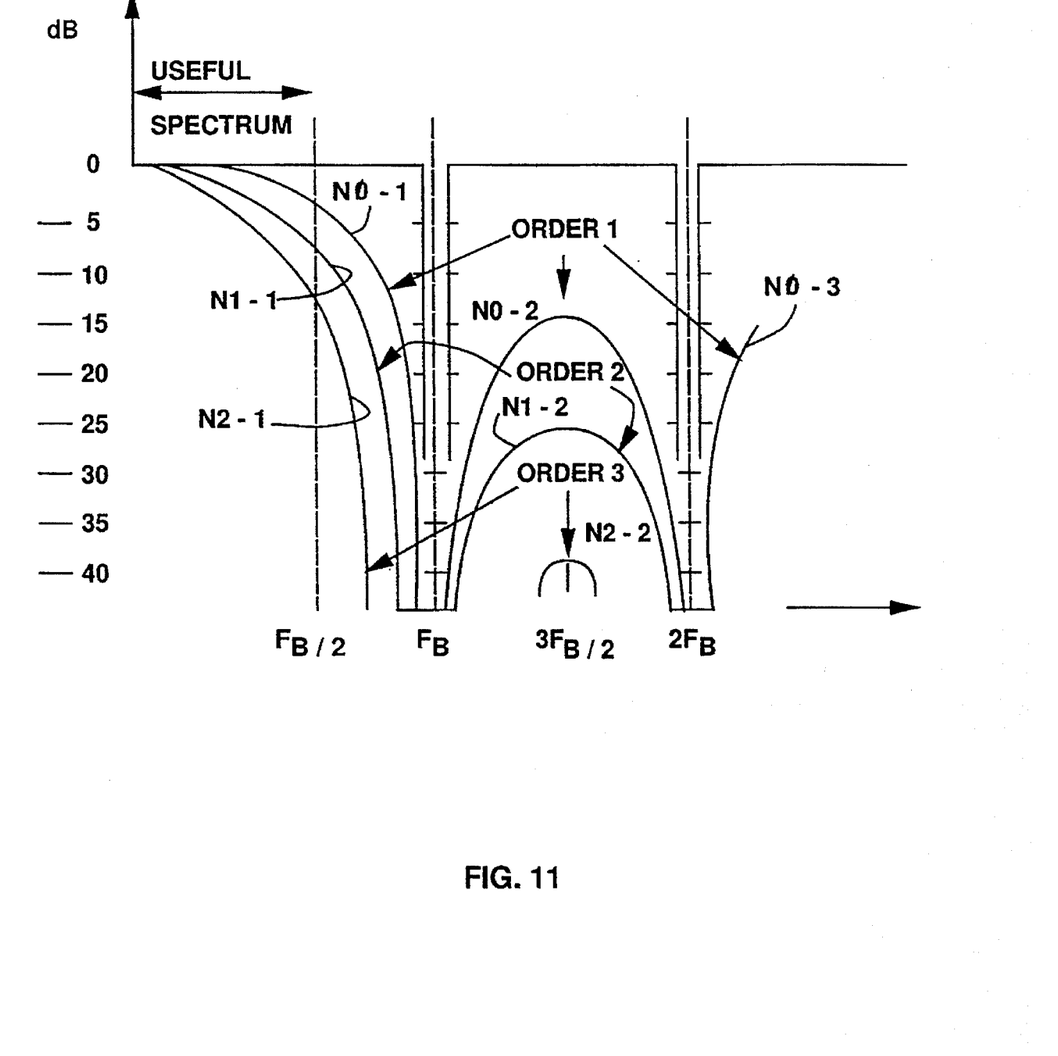
FIG. 11 shows the spectrum diagram at high frequency of the convolutional DAC architecture.

FIG. 11 shows the transfer function of the convolution DAC architecture (time domain convolution with a gate function).

This diagram represents the results of particular cases of filtering with the function (SinX/X)**(N+1) (where N is an integer).

The frequencies are represented on the X-axis and the negative gains are represented on the Y-axis. Fb is the input frequency of the clock splitter.

For N=0, we obtain:

a first curve (N1-1) starting at the original point 0 for frequencies varying from 0 to Fb, with a vertical asymptote at F=Fb, a second curve (N1-2) having two asymptotes at F=Fb and F=2Fb, and reaching its peak near F=3Fb/2, a third curve (N1-3) having a similar shape and so on ...

This filtering is performed with a multiplier function which is a constant function. For N=1, we obtain:

a first curve (N2-1) starting at the original point 0 for frequencies varying from 0 to Fb, with a vertical asymptote at F=Fb, compared to the first curve where N=1, this curve decreases faster.

a second curve (N2-2) having two asymptotes at F=Fb and F=2Fb, and reaching its peak near F=3Fb/2 below the one of the curve (N1-2), and so on ...

This filtering is performed with a generating function which is a periodic triangular function.

For N=2, we obtain:

a first curve starting at the original point 0 for frequencies varying from 0 to Fb, with a vertical asymptote at F=Fb, this curve decreases faster than the previous ones, a second curve (N2-2) having two asymptotes at F=Fb and F=2Fb, and reaching its peak near F=3Fb/2 below the peaks of the previous ones, and so on ...

This filtering is performed with a generating function which is a periodic parabolic curve.

I claim:

1. A digital to analog converter for generating a smoothed signal having a limited high frequency spectrum, said converter receiving incoming data on a data bus and being clocked by a clock signal of frequency Fb, characterized in that it comprises:

means (10) for receiving said incoming data and for splitting it into N units data, said means being composed of N shift registers and N data buffers, the N shift registers sorting the incoming data to store successive of units of the N data in successive data buffers;

means (11) for splitting the clock signal (Fb) into N signals having a frequency equal to Fb/N with a phase delay of N/Fb respective to each other, each said signal clocking a specific data buffer;

means (13) comprising N multiplying digital to analog converters (DACs) being delayed by a phase T=N/Fb, each said multiplying DAC receiving data from the corresponding data buffer through a data bus; and means (12) for providing N multiplier generators, each one using identical periodic functions (M1, ..., Mn) of period N/Fb, the phase of each multiplier generator being shifted by a delay of N/Fb respective to the previous generator according to the corresponding phase of the clock splitter, each said multiplier generator being clocked by the corresponding clock signal of frequency (Fb/N) for modulating the multiplying DAC reference with periodic signals (G1, ... Gn) which are convoluted with the digital inputs.

2. A digital to analog converter according to claim 1 wherein the transfer function $S(w)=(\sin(pi*f*t)/(pi*f*t))**2$ is applied to the spectrum of the incoming data, characterized in that:

said means (10) for receiving the incoming data splits said data into two sources of data (odd data and even data);

said means (11) for splitting clock signal splits the clock signal Fb into odd and even clock signals of frequency (Fb/2);

said means (13) comprising 2 multiplying digital to analog converter (501, 502) being delayed by a phase T=2/Fb; and said means (12) for providing 2 multiplier generators, each one using identical periodic triangular functions of period 2/Fb, the phase of each multiplier generator being shifted by a delay of 2/Fb.

3. A digital to analog converter according to claim 1 wherein the transfer function S(w)=(sin(pi*f*t)/(pi*f*t))**3 is applied to the spectrum of the incoming data, characterized in that:

said means (10) for receivingthe incoming data splits said data into three shift registers which sort the data (data0, data1 and data2) to store them successively in the respective three data buffers;

said means (11) splitting the clock signal Fb into three clock signals (clk0, clk1, clk2) of frequency (Fb/3), each said clock signal clocking respectively the three data buffers;

said means (13) comprising three multiplying DAC (900, 910, 920) being delayed by a phase T=3/Fb, each said multiplying DAC receiving data from the corresponding data buffers through a corresponding data bus (902, 912, 922); and said means (12) for providing 3 multiplier generators for providing three periodic signals (G0(t), G1(t) and G2(t)), each multiplier generator comprising a current generator (801, 802 or 803) being clocked by said clock signals (clk0, clk1 or clk2) and connected to a capacitance (C1, C2 or C3 ) in parallel with a current generator (810, 820 or 830) through a node (N1, N2 or N3) which controls a current generator (804, 805 or 806) which feeds respectively a capacitance (C11, C21 or C31) through a node (N11, N21 or N31) generating the periodic parabolic signals (G0(t), G1(t) or G2(t)), said signals being convoluted with the digital inputs in said means (13).

4. A digital to analog converter according to any one of the previous claims characterized in that it is suited to silicon integration.

\* \* \* \* \*